United States Patent [19]

Adair et al.

[11] Patent Number: 4,663,266

[45] Date of Patent: May 5, 1987

[54] THERMAL DEVELOPMENT OF PHOTOSENSITIVE MATERIALS EMPLOYING MICROENCAPSULATED RADIATION SENSITIVE COMPOSITIONS

[75] Inventors: Paul C. Adair, Chillicothe; Michael K. McLain, Columbus, both of Ohio

[73] Assignee: The Mead Corporation, Dayton, Ohio

[21] Appl. No.: 683,321

[22] Filed: Dec. 17, 1984

Related U.S. Application Data

[63] Continuation of Ser. No. 517,115, Jul. 25, 1983, abandoned.

[51] Int. Cl.$^4$ .............................................. G03G 9/16
[52] U.S. Cl. ..................................... 430/138; 346/200
[58] Field of Search .......................... 430/138, 24, 235; 428/320.6; 282/27.5

[56] References Cited

U.S. PATENT DOCUMENTS 3,576,660  4/1971  Bayless et al. .................. 428/320.6

FOREIGN PATENT DOCUMENTS 17733  8/1969  Japan .
124343  8/1982  Japan .................................. 430/138

Primary Examiner—John L. Goodrow
Attorney, Agent, or Firm—Biebel, French & Nauman

[57] ABSTRACT

An improved means for developing photosensitive sheets employing a microencapsulated radiation sensitive composition wherein the microcapsules typically contain a thermally activatable gas generating compound and following exposure the imaging sheet is heated to rupture the microcapsules and develop the image.

19 Claims, No Drawings

THERMAL DEVELOPMENT OF PHOTOSENSITIVE MATERIALS EMPLOYING MICROENCAPSULATED RADIATION SENSITIVE COMPOSITIONS

This application is a continuation of application Ser. No. 517,115 filed July 25, 1983, now abandoned.

BACKGROUND OF THE INVENTION

The present invention relates to a convenient means for developing photosensitive materials employing a microencapsulated radiation sensitive composition. More particularly it relates to a photosensitive material of the above type having thermally rupturable microcapsules, wherein the microcapsules are ruptured by the direct application of heat to the photosensitive material following exposure.

Photosensitive materials employing microencapsulated radiation sensitive compositions are the subject of U.S. applications Ser. Nos. 310,356 and 320,643 filed Nov. 12, 1981 assigned to The Mead Corporation and Japanese Laid-Open Application Nos. 57-124343, 57-179836 and 57-197538 to Fugi Photo Film Co., Ltd. In a typical example of the aforementioned photosensitive materials, a color precursor of the electron donor type is encapsulated with a radiation sensitive material and a layer of the microcapsules is coated on a support to provide an imaging sheet. The imaging sheet is image-wise exposed and then assembled with a developer sheet carrying a material which reacts with the color precursor to produce a color image. The assembled sheets are passed together through the nip between two pressure rollers whereupon the microcapsules rupture and image-wise release the color precursor which is transferred to the developer sheet where it reacts and forms an image. In another embodiment, the developer is carried on the imaging sheet in a layer underlying the layer of microcapsules. This sheet is exposed and passed through a pressure nip whereupon the microcapsules rupture and the color precursor migrates to the underlying developer layer where it reacts and forms an image.

The following patents describe other photosensitive imaging materials employing microcapsules:

Berman, U.S. Pat. No. 3,219,446 discloses a transfer imaging process in which a blue-black dye is encapsulated with a photocrosslinkable polymer or a photopolymerizable monomer in a film or a layer of discrete microcapsules. In this system imaging is accomplished by image-wise exposing the layer of the encapsulated material to electromagnetic radiation to crosslink the polymer or polymerize the monomer. This is said to cause the liquid in the exposed microcapsules to assume a non-liquid, rigid condition, such that upon rupturing the microcapsules only the dye from the unexposed microcapsules is transferred to a receiving sheet where images are formed.

Phillips, U.S. Pat. No. 3,700,439, discloses a process wherein Michler's ketone is encapsulated in a conventional manner and provided as a layer on a support. Michler's ketone is not a color former, but irradiation of the ketone converts it to a colorless, acid colorable, dye precursor. Thus, by image-wise exposing the Phillips material to actinic radiation and rupturing the microcapsules in contact with an acid developer layer, such as a layer of acid clay, a visible image is obtained in the areas in which the ketone has been converted to the acid colorable form by irradiation. Phillips also discloses a self-contained system in which the acid developer is on the same support as the microcapsules containing the Michler's ketone.

Levy, U.S. Pat. No. 4,149,887, relates to a microcapsule-containing imaging material having a photoconductive internal phase which is exposed in an RF field. Exposure increases the conductivity of the internal phase and causes the microcapsules to heat, swell and then rupture in the exposed areas thereby freeing the contents to form images. The microcapsules may contain color precursors which form images by reacting with a developing agent.

Japanese Kokai 34488/1977 to Nihon Denshin Denwa Kosha discloses an imaging material in which the microcapsule walls contain a photosensitive material which decomposes and generates a gas upon exposure to actinic radiation. Upon exposure, the capsules rupture and release their internal phase which contains an image-forming agent which reacts with a developer material and produces an image.

Japanese Kokai, 6212/1974 to Matsushita Denki Sangyo K.K., relates to a recording material in which microcapsules having a photocrosslinkable polymer wall contain a colorless or substantially colorless precursor in a polar solvent and, optionally, an acid dye developer. The polar solvent presents the color precursor from reacting with the acid dye developer and forming a color image. Images are formed by image-wise exposing the material to actinic radiation and rupturing the microcapsules in the unexposed areas, whereupon the polar solvent evaporates and color development occurs.

Japanese Kokai Nos., 9519 and 9520/1978 to K. K. Ricoh, relate to imaging systems in which the microcapsules contain a radiation curable internal phase including a dye precursor. Images are formed by image-wise exposing a layer of the microcapsules to light and selectively transferring the microcapsules from the unexposed areas to a receiving sheet. The microcapsules are not ruptured. Upon subsequent wet development processing of the transfer sheet with a dye developer, the dye precursor in the microcapsules is converted to a colored form and an image is obtained.

British Pat. Nos. 1,058,798; 1,141,475; and 1,193,923 to DuPont relate to imaging materials which employ a photopolymerizable substratum comprising a solid binder having a polymerizable ethylenically unsaturated compound dispersed therein. Images are formed by image-wise exposing the materials to actinic radiation. Exposure controls the rate of diffusion of a developer material into or out of the photopolymerizable substratum.

British Pat. No. 1,001,832 to DuPont discloses an imaging material in which a color former may be incorporated in a layer of a photopolymerizable, ethylenically unsaturated compound and an oxygen impermeable cover sheet is placed over the photopolymerizable layer during exposure to limit the concentration of atmospheric oxygen in contact with the photopolymerizable layer and thereby increase the speed and sensitivity of the photopolymerizable material.

Currently, the principal means used to develop photosensitive materials employing microencapsulated radiation sensitive compositions are devices which physically act on the microcapsules to rupture them such as nip rollers and burnishing devices. These devices are costly to manufacture and use, and require frequent maintenance. Thus, there is a need for a less expensive and more efficient means of developing these materials.

DEFINITIONS

The term "microcapsule" is used herein to refer to both microcapsules having a discrete wall and microcapsules formed in an open phase system wherein discrete droplets of photoactive internal phase are dispersed in a binder. Thus, whenever reference is made to "microcapsules" or "encapsulation" in the specification and appended claims, without reference to a discrete microcapsule wall, both types of microcapsules are intended.

The term "image areas" as used herein means the areas in which the internal phase is released from the microcapsules, regardless of whether the image formed is a positive or negative image.

The term "actinic radiation" is open to the entire electromagnetic spectrum and includes ultraviolet, infrared, visible, X-ray and other radiation sources such as ion beam.

SUMMARY OF THE INVENTION

A principal objective of the present invention is to provide a more convenient means of developing photosensitive materials employing microencapsulated radiation sensitive compositions wherein following exposure the microcapsules are ruptured by uniformly heating the photosensitive material.

It has been explained previously in commonly assigned application Ser. Nos. 320,356 and 320,643 that irradiation of photosensitive materials, which employ a microencapsulated radiation sensitive composition, causes a change in the viscosity of the internal phase of the microcapsules which prevents the microcapsules from rupturing or releasing their contents. By image-wise exposing an imaging sheet provided with a layer of photoactive microcapsules to actinic radiation and rupturing the microcapsules, the internal phase is released from the microcapsules in relation to the degree of exposure. If the microcapsules contain an image-forming agent, such as a visible dye or a color former, the image-forming agent is released from the microcapsules and an image is formed upon transfer of the dye or upon reaction of the color former with a developer material.

Thermally rupturable photoactive microcapsules are employed in the present invention which can be ruptured by heating the imaging sheet following exposure. These microcapsules can be prepared by incorporating a thermally decomposable compound or a solvent of appropriate volatility in the internal phase of the capsules such that a gas is generated inside the capsules upon heating the imaging sheet. Alternatively, thermally rupturable microcapsules can be prepared by forming the capsules from a thermally decomposable wall material. These heat activatable materials are selected such that the capsules can be ruptured by heating the imaging sheet without substantially advancing the imaging photochemistry. If the imaging photochemistry is advanced by heating, image quality may suffer.

An imaging sheet in accordance with the present invention in its simplest form comprises a support and a layer of thermally rupturable microcapsules on the support in which the internal phase of the capsules include a radiation sensitive composition which undergoes a change in viscosity upon exposure to actinic radiation, wherein the imaging sheet is capable of forming images by image-wise exposing the sheet to actinic radiation and heating the sheet such that the microcapsules rupture and image-wise release the internal phase.

In accordance with one embodiment of the invention a heat activatable gas generating material is incorporated in the internal phase and/or the wall material of the microcapsules. Suitable gas generating materials include compounds which decompose upon heating and release a gas molecule. Various blowing agents can be used as heat activatable materials in the present invention including certain solvents and azo compounds.

An image-forming agent is usually associated on the imaging sheet with the microcapsules, and the image-forming agent is mobilized or otherwise activated when the microcapsules are ruptured and the internal phase is released. One example of a suitable image-forming agent is a color former; another example is an oil soluble dye; still another example is a chelate-forming compound. However, it is not necessary to use an image-forming agent with the sheet since the radiation sensitive composition itself can function in that capacity as described later herein.

One embodiment of the invention is a self-contained imaging sheet wherein a developer material is incorporated in the imaging sheet such that when the microcapsules are ruptured, the image-forming agent reacts with the developer to produce an image.

The present invention also provides imaging processes wherein the aforementioned materials are exposed image-wise to actinic radiation, and the imaging sheet is heated to rupture the microcapsules. If images are formed by a transfer process, the exposed imaging sheet can be heated in contact with the image-receiving developer sheet or the sheet can be heated separately and thereafter assembled with the image receiving sheet for transfer.

DETAILED DESCRIPTION OF THE INVENTION

The imaging sheets and processes of the present invention can be used in conjunction with various radiation sensitive materials and image-forming agents to produce images by a number of different mechanisms.

For example, positive working photohardenable or negative working photosoftenable radiation sensitive compositions can be used. Photohardenable compositions such as photopolyermizable and photocrosslinkable materials increase in viscosity or solidify upon exposure and yield positive images. Photosoftenable materials, such as some photodecomposable or photodepolymerizable materials, decrease in viscosity and result in negative images.

Ethylenically unsaturated organic compounds are useful radiation curable materials. These compounds contain at least one terminal ethylene group per molecule. Typically, they are liquid. Polyethylenically unsaturated compounds having two or more terminal ethylene groups per molecule are preferred. An example of this preferred subgroup are ethylenically unsaturated acid esters of polyhydric alcohols, such as trimethylol propane triacrylate (TMPTA).

Another suitable radiation sensitive composition is an acrylate prepolymer derived from the partial reaction of pentaerythritol with acrylic acid or acrylic acid esters. Photosensitive compositions based on these prepolymers having an acrylate functionality of between approximately two and three are available commercially in two-package systems from The Richardson Company, Melrose Park, Ill., such as RL-1482 and RL- 1483. These are recommended to be mixed together to form a radiation curable clear varnish in a ratio of 4.4 parts of RL-1482 to one part RL-1483.

Another group of substances useful as radiation sensitive compositions include isocyanate modified acrylic, methacrylic and itaconic acid esters of polyhydric alcohols as disclosed in U.S. Pat. Nos. 3,783,151; 3,759,809 and 3,825,479, all to Carlick et al. Radiation curable compositions including these isocyanate modified esters and reactive diluents such as tetraethylene glycol diacrylate as well as photoinitiators such as chlorinated resins, chlorinated paraffins and amine photoinitiation synergists are commercially available as over print varnishes from Sun Chemical Corp., Carlstat, N.J., under the tradename of Sun Cure resins.

The radiation sensitive component of several radiation curable inks is also suitable for use in this invention. An example of this type of material is a mixture of pentaerythritol acrylate and a halogenated aromatic, alicyclic or aliphatic photoinitiator, as disclosed in U.S. Pat. No. 3,661,614 to Bessemir et al.

An example of radiation depolymerizable materials that may be useful in other embodiments of the invention are 3-oximino-2-butanone methacrylate which undergoes main chain scission upon U.V. exposure and poly 4'-alkyl acylophenones. See Reichmanis, E.; *Am. Chem. Soc. Div. Org. Coat. Plast. Chem. Prepr.* 1980. 43, 243-251 and Lukac. I.; Chmela S., Int. Conf. on Modif. Polym. 5th. Bratislave, Czech. July 3-6, 1979, I.U.P.-.A.C. Oxford, England 1979, 1, 176-182.

The radiation sensitive composition must make up a large enough proportion of the internal phase to effectively control the flow of the internal phase upon development. This generally means that the radiation sensitive material constitutes approximately 40 to 99% by weight of the internal phase of the microcapsules.

In most cases, the radiation sensitive composition includes a photoinitiator. It is possible to use either photoinitiators which are converted to an active species by homolytic cleavage upon absorption of radiation or those which generate a radical by abstracting a hydrogen from a hydrogen donor. There may also be used photoinitiators which complex with the sensitizer to produce a free radical generating species or photoinitiators which otherwise generate radicals in the presence of a sensitizer. If the system relies upon ionic polymerization, the photoinitiator may be the anion or cation generating type, depending on the nature of the polymerization. It is important, however, that the photoinitiator be thermally inactive or at least not active at the temperatures required to rupture the capsules upon development.

Examples of photoinitiators useful in the present invention include diaryl ketone derivatives, quinones and benzoin alkyl ethers. Where ultraviolet sensitivity is desired, suitable photoinitiators include alkoxy phenyl ketones, O-acylated oximinoketones, polycyclic quinones, phenanthrenequinone, naphthoquine, diisopropylphenanthrenequinone, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones, and haloalkanes.

In many cases it is advantageous to use a combination of imaging photoinitiators. For ultraviolet sensitivity one desirable combination is a combination of Michler's ketone and benzoin methyl ether (preferred ratio 2:5). Another useful combination is 2,2'-dimethoxy-2-phenylacetophenone, isopropylxanthone and ethyl para-dimethylaminobenzoate. The later is preferably used with TMPTA to provide a radiation sensitive composition.

Various image-forming agents can also be used. For example, images can be formed by the interaction of color formers and color developers of the type conventionally used in the carbonless paper art. In addition, images can be formed by the color producing interaction of a chelating agent and a metal salt or by the reaction of certain oxidation-reduction reaction pairs, many of which have been investigated for use in pressure-sensitive carbonless papers. Alternatively, an oil soluble dye can be used as an image-forming agent and images can be formed by transfer of the dye to plain or treated paper. The internal phase itself has image-forming capability. For example, it is also known that the toner used in xerographic recording processes selectively adheres to the image areas of an imaging sheet exposed and developed as in the present invention.

Furthermore, the image-forming agent can be provided inside the microcapsules, in the microcapsule wall, or outside the microcapsules in the same layer as the microcapsules or in a different layer. In the latter cases, the internal phase picks up the image-forming agent (e.g., by dissolution) upon being released from the microcapsules and carries it to the developer layer or an associated developer sheet.

Typical color precursors useful in the aforesaid embodiments include colorless electron donating type compounds. Representative examples of such color formers include substantially colorless compounds having in their partial skeleton a lactone, a lactam, a sultone, a spiropyran, an ester or an amido structure such as triarylmethane compounds, bisphenylmethane compounds, xanthene compounds, fluorans, thiazine compounds, spiropyran compounds and the like. Crystal Violet Lactone and Copikem X, IV and XI (products of Hilton-Davis Co.) are often used alone or in combination as color precursors in the present invention.

Illustrative examples of color developers useful in conjunction with the embodiment employing the aforesaid color precursors are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts or aromatic carboxylic acids such as zinc salicylate, tin salicylate, zinc 2-hydroxy naphthoate, zinc 3,5 di-tert butyl salicylate, oil soluble metal salts or phenol-formaldehyde novolak resins (e.g., see U.S. Pat. Nos. 3,672,935; 3,732,120 and 3,737,410) such as zinc modified oil soluble phenol-formaldehyde resin as disclosed in U.S. Pat. No. 3,732,120, zinc carbonate etc. and mixtures thereof.

The aforementioned color formers and color developers can be used interchangably, that is the color former can be encapsulated and the developer can be provided in a layer or vice versa.

An example of an image-forming salt-chelate pair is nickel nitrate and N,N'bis (2-octanoyloxyethyl)-dithiooxamide. It is preferable to encapsulate the chelating agent and use the salt in a developer layer.

Substantially any benign colored dye can be used as an image-forming agent. A few examples are Sudan Blue and Rhodamine B dyes. The dyes are preferably oil soluble since the most easily employed encapsulation techniques are conducted using an aqueous continuous phase.

The most common substrate for this invention is paper. The paper may be a commercial impact raw stock, or special grade paper such as cast-coated paper or chrome-rolled paper. The latter two papers are preferred when using microcapsules having a diameter between approximately 1 and 5 microns, because the surface of these papers is smoother and therefore the microcapsules are not easily embedded in the stock fibers. Transparent substrates such as polyethylene terephthalate and translucent substrates can also be used in this invention.

The discrete walled microcapsules used in the present invention can be produced using known encapsulation techniques including coacervation, interfacial polymerization, polymerization of one or more monomers in an oil, etc. Representative examples of suitable wall-formers are gelatin materials (see U.S. Pat. Nos. 2,730,456 and 2,800,457 to Green et al) including gum arabic, polyvinyl alcohol, carboxy-methyl-cellulose; resorcinol-formaldehyde wall formers (see U.S. Pat. No. 3,755,190 to Hart et al); isocyanate wall-formers (see U.S. Pat. No. 3,914,511 to Vassiliades); isocyanate-polyol wall-formers (see U.S. Pat. No. 3,796,669 to Kirintani et al); urea formaldehyde wall-formers, particularly urea-resorcinol-formaldehyde in which oleophilicity is enhanced by the addition of resorcinol (see U.S. Pat. Nos. 4,001,140; 4,087,376 and 4,089,802 to Foris et al); and melamine-formaldehyde resin and hydroxypropyl cellulose (see commonly assigned U.S. Pat. No. 4,025,455 to Shackle). The material used to form the microcapsule walls must be selected for the radiation sensitive composition that is to be encapsulated such that it is substantially transparent to the exposure radiation. For the systems described above, urea-resorcinol-formaldehyde and gelatin microcapsules are generally preferred.

The mean microcapsule size used in the present invention generally ranges from about 1 to 25 microns.

An open phase system may be used instead of discrete microcapsules. This can be done by dispersing what would otherwise be the internal phase throughout a binder as discrete droplets and coating the composition on the substrate. Suitable coatings for this embodiment include polymer binders whose viscosity has been adjusted to match the dispersion required in the coating. Suitable binders are gelatin, polyvinyl alcohol, polyacrylamide, and acrylic lattices.

In accordance with one embodiment of the invention, the microcapsules are rendered thermally rupturable by incorporating in the internal phase a heat activatable gas generating agent. The preferred gas generating agents used in the present invention are activated by heating to a temperature in the range of about 90° to 250° C. If the compound releases a gas at temperatures below 40° C., the imaging sheet may be inadvertently developed upon exposure to ambient heat. Many photoinitiators can also be activated by heat. Hence, if the gas generating agent must react at a temperature below the temperature at which the photoinitiator is heat-activated. These temperatures will vary with the particular photoinitiator system.

The heat activatable gas generating agent is incorporated in the internal phase of the microcapsules in an amount sufficient to generate sufficient gas to rupture the microcapsules upon heating. The amount will vary with the particular agent that is used. Some typical examples are shown below.

Compounds which generate a gas by decomposition upon exposure to heat are well known. Typical examples of useful thermally decomposable gas generating compounds include various blowing agents. Azo compounds such as azodicarbonamide, 1,3-diphenyltriazene, 1,3-bis-(o-xenyl)triazene, 2,2-azobisisobutyronitrile, 1,1'-azobiscyclohexanecarbonitrile, azobisisobutyramidoxime, and diarylpentazadienes are useful. In most cases it is necessary to incorporate these compounds in the internal phase in solid form since the gas generating agents are typically not soluble in an oil phase. Other compounds potentially useful as gas generating agents are 4,4'-oxybis-(benzenesulfonyl hydrazide), N,N'-dimethyldinitrosoterephthalamide, dinitrosopentamethylenetetramine, ethylene carbonate, guanidine nitrite, guanylurea nitrite, acetamidine nitrite, urea oxalate, 1,1'-dithiodiformamidine, diethylazodicarboxylate, benzil monohydrazone, 4,4'-oxybis(benzenesulfonyl hydrazide), 4,4'-oxybis(benzenesulfonyl semicarbazide), p-t-butylbenzoyl azide, N,N'-dimethyl-N,N'-dinitrosoterephthalamide, quinone diazides, and other azo compounds.

In another embodiment of the invention the heat activatable gas generating agent is a solvent which preferably has a boiling point in the range of about 90° to 250° C. and is capable of dissolving the radiation sensitive composition. Representative examples of suitable solvents are xylene, kerosene, toluene, and light petroleum fractions.

Thermally rupturable capsules can also be prepared by using a thermally decomposable wall forming material to form the capsules. Thermally decomposable open phase systems can be formed by dispersing the internal phase, including the radiation sensitive composition, in a low melting wax such as paraffin or microcrystalline wax. Upon exposing these materials to actinic radiation through a mask, in the case of a photohardenable radiation sensitive composition, the internal phase is hardened in the exposed areas. By applying heat to the microcapsules, the wax melts and releases the internal phase from the unexposed unhardened areas.

Microcapsules having discrete capsule walls that are thermally decomposable can be prepared from wall formers such as hydroxypropyl cellulose. Anther example of a thermally decomposable wall former is gelatin. For the reasons already indicated, it is preferred that the wall former melt or decompose at a temperature in the range of 90° to 250° C.

As previously indicated, the imaging sheets of the present invention can be made sensitive to ultraviolet, infrared, visible, X-ray and other types of actinic radiation. Depending upon the exposure source used, the nature of the exposing radiation, and the nature of the radiation sensitive composition, exposure alone may cause a sufficient change in the viscosity of the internal phase to control imaging. Otherwise, exposure can be used to initiate or advance the photochemistry in the exposed areas and the heat treatment can be used to complete the polymerization process and render the internal phase unreleasable upon heating.

Imaging sheets embodying the invention imaging system can be exposed using a fairly simple exposure apparatus. In its simplest form for reflection imaging, the apparatus requires only a radiation source, means of focusing the exposure radiation from the original onto the imaging sheet, means to join the imaging sheet with the developer sheet (in the case of a transfer material), and means for heating at least the imaging sheet to rupture the microcapsules. The imaging sheet can be heated alone or in assembly with a developer sheet when a developer sheet is required. It is generally preferred to heat the sheet assembled with the developer sheet because heating also accelerates the reaction of the developer and the image forming agent.

Imaging sheets exposed in accordance with the present invention can be ruptured by passing the sheet through a pair of rollers, at least one of which is heated to a temperature sufficient to rupture the microcapsules. Alternatively, the imaging sheet can be placed in contact with a heated platen. It may also be possible to rupture the capsules by uniformly irradiating the surface of the imaging sheet with infrared radiation or by directing heated air against the surface of the imaging sheet.

The present invention is further illustrated by the following non-limiting examples.

EXAMPLE 1

A self-contained imaging sheet was prepared by coating the following compositions, in order, on a sheet of 80 pound Black and White Enamel Stock (a product of The Mead Corporation):

Developer Coating Composition

A mixture of 240 g 25% Tamol 731 (Rohm & Haas Co.), 75 g dry HT clay, 1000 g SD-74 Resin (a synthetic developer manufactured by Fuji Photo Film Co., Ltd.), 15 g Calgon T (Calgon, Inc.) and 30 g Dequest 20006 (Monsanto Co.) was ground to a particle size of less than 5 microns. 65 parts by weight of the ground mixture was added to 25 parts HT clay and 10 parts Dow 501 Latex (Dow Chemical Co.). This mixture was coated on the aforementioned enamel stock using a No. 10 Meyer rod in a coat weight of 5 pounds per 3300 sq. ft.

Microcapsule Coating

A solution of 50 g TMPTA, 12 g Irgacure 651 (Ciba Giegy), 1 g Quantacure ITX (Ward-Blenkinsop & Co., Ltd.) 6 g of 50% Copikem X in dibutyl succinate (Hilton Davis Co.) and 2 g of azodicarbonamide, as the photoactive internal phase was prepared. This solution was microencapsulated as follows:

A mixture of 22.8 g 20% Isobam, 54.0 g water and 30.8 g 10% gum arabic was heated with stirring to 60° C. and the pH was adjusted to 4.0 with the addition of 20% sulfuric acid. Thereafter 8.3 g urea and 0.8 g resorcinol were added and the solution was stirred at 60° C. for 15 minutes to prepare a continuous phase. The continuous phase was placed in a Waring blender and the photoactive internal phase at 60° C. was added with blending at a Variac setting of 90 at 140 V for 30 seconds. Thereafter the speed of the blender was reduced to 40 and 21.4 ml of 37% formaldehyde was added. Blending was continued at that speed for 2 hours at 60° C. The emulsion was then transferred to a metal beaker and 0.6 g of ammonium sulfate in 12.2 g water was added. This emulsion was stirred with an overhead mixer at 60° C. for another hour and the pH was adjusted to 9.0 using a 10% solution of sodium hydroxide. Finally, 2.8 g sodium bisulfite was dissolved in the mixture with stirring.

The microcapsule preparation was diluted 1:1 with water containing 1% Triton-X 100 (Rohm & Haas Co.) and coated on the developer layer to provide a coat weight of about 6 g/m$^2$.

The self-contained imaging sheet prepared as above was exposed through a step wedge for 16 seconds in a ultraviolet sensitometer. Thereafter the imaging sheet was taped, coated side up, to a glass microscope slide and placed on a temperature gradient melting point apparatus (185°–230° C.) manufactured by Parr Instrument Co. and heated. The step wedge image appeared in 15 seconds. The imaging sheet provided D max=0.95 and D min=0.46. In this example a temperature gradient heating device was used in order to determine the relationship between image density and development temperature. In commercial practice a uniform development temperature would be used.

REFERENCE EXAMPLE

For reference, an imaging sheet prepared and exposed identical to the imaging sheet in Example 1 was developed by passing the sheet through pressure rollers. This sheet provided D max=1.00 and D min=0.20. A control sheet was prepared as in Example 1 without the heat activatable material and was exposed and developed as in Example 1. A low density negative image was obtained.

EXAMPLE 2

Example 1 was repeated except the photoactive internal phase contained 40% by weight xylene instead of azodicarbonamide as the heat activatable material. The sheet was exposed and developed as in Example 1 and the sheet provided D max of 0.63 and D min of 0.50. The step wedge image appeared in 60 seconds. When an identical sheet was developed by passing the sheet through pressure rollers, D max was 1.03 and D min was 0.32.

EXAMPLE 3

This example illustrates an imaging sheet in which the microcapsule walls melt upon development.

A photoactive internal phase was prepared by mixing 12 g Irgacure 651, 1 g isopropylthioxanthane, 1 g ethyl-p-dimethylaminobenzoate and 6 g of Copikem X in 50% dibutylsuccinate. This material was microencapsulated in hydroxypropylcellulose as follows:

A continuous phase was prepared by mixing 47 g of 5% Klucel L solution in water with 73 g water. Once this solution was homogeneous it was poured into a Waring blender. Immediately prior to adding the photoactive internal phase, 3.5 g of N-100 isocyanate (a product of Mobay Chemical Co.) and 1.5 g of SF-50 isocyanate (a product of Union Carbide Corp.) were added to the internal phase at room temperature. The internal phase was then quickly added to the continuous phase and stirred 2 minutes at the Variac setting of 90 at 140 volts in the blender. Thereafter the mixture is transferred to a beaker and cured by heating 4 hours at 48° C. The capsules were coated on a sheet pre-coated in a coating weight of 7.4 g/m$^2$ with the developer composition described in Example 1. The capsule layer was thereafter overcoated with an oxygen barrier layer of 100% Rhom & Haas Co. P-310 latex.

Imaging sheets prepared as above were exposed and developed in an ultraviolet sensitometer as in Example 1. The step wedge image appeared in 30 seconds. The imaging sheets provided D max of 0.99 and D min of 0.42. An identical sheet developed by passage through pressure rollers provided D max=0.88 and D min=0.24.

Having described the invention in detail and with respect to specific embodiments thereof, it will be apparent that numerous variations and modifications are possible without departing from the scope of the following claims:

What is claimed is:

1. In an imaging sheet comprising a support and a layer of microcapsules containing an internal phase which includes a radiation sensitive composition which undergoes a change in viscosity upon exposure to actinic radiation, said microcapsules containing an image-forming agent, and said sheet being capable of forming images by image-wise exposing said sheet to actinic radiation and subjecting said microcapsules to a uniform rupturing force whereupon said microcapsules rupture and image-wise release said internal phase; the improvement wherein said sheet is designed to be thermally developed and said microcapsules are thermally rupturable microcapsules characterized in that said microcapsules contain a heat activatable gas generating material which decomposes and generates a sufficient quantity of gas to rupture said microcapsules upon heating said sheet to a temperature of about 90° to 250° C.

2. The imaging sheet of claim 1 wherein said heat activatable gas generating material is an azo compound.

3. The imaging sheet of claim 1 wherein said microcapsules have discrete walls.

4. The imaging sheet of claim 3 wherein said radiation sensitive composition includes an ethylenically unsaturated compound and a photoinitiator.

5. In an imaging sheet comprising a support and a layer of microcapsules on said support, said microcapsules having discrete microcapsules walls containing a radiation sensitive composition and a color former in the internal phase, said radiation sensitive composition including an ethylenically unsaturated compound and a photoinitiator such that said radiation sensitive composition undergoes an increase in viscosity upon exposure to actinic radiation, said imaging sheet being capable of forming images by image-wise exposing said imaging sheet to actinic radiation and subjecting said sheet to a uniform rupturing force in the presence of a developer material whereupon said microcapsules rupture and image-wise release said internal phase and said color former reacts with said developer and forms an image; the improvement wherein said imaging sheet is designed to be thermally developed and said microcapsules are thermally rupturable microcapsules characterized in that said microcapsules contain a heat activatable gas generating material which decomposes and generates a sufficient quantity of gas to rupture said microcapsules upon heating said sheet to a temperature of about 90° to 250° C.

6. The imaging sheet of claim 5 wherein said heat activatable gas generating material is an azo compound.

7. The imaging sheet of claim 5 wherein said sheet further comprises a layer of a developer material interposed between said support and said layer of microcapsules so as to provide a self-contained imaging sheet.

8. The imaging sheet of claim 5 wherein a developer material is provided on a support separate and distinct from said support carrying said microcapsules so as to provide in combination with said imaging sheet a transfer imaging system.

9. A process for imaging which comprises, in sequence,
image-wise exposing an imaging sheet comprising a support having on one surface thereof a layer of thermally rupturable microcapsules containing a radiation sensitive composition which undergoes a change in viscosity upon exposure to actinic radiation, and
uniformly heating said imaging sheet to rupture said microcapsules whereupon said microcapsules image-wise release said internal phase.

10. In a process for forming images which comprises image-wise exposing an imaging sheet comprising a support containing in the internal phase an image-forming agent and a radiation sensitive composition which undergoes a change in viscosity upon exposure to actinic radiation, and subjecting said sheet to a uniform rupturing force; the improvement wherein (i) the internal phase of said microcapsules contains a heat activatable gas generating material which decomposes and generates a sufficient quantity of a gas to rupture said microcapsules upon heating to 90° to 250° C.; and (ii) said microcapsules are subjected to said uniform rupturing force by uniformly heating said imaging sheet.

11. The process of claim 10 wherein said microcapsules have a discrete capsule wall.

12. The process of claim 11 wherein said image-forming agent is a substantially colorless electron donating color former and said heating step is conducted in the presence of an electron accepting color developer.

13. The process of claim 10 wherein said process consists essentially of the steps of image-wise exposing said imaging sheet and uniformly heating said imaging sheet to rupture said microcapsules.

14. The process of claim 13 wherein said heating step is carried out in the presence of a developer material provided on said imaging sheet.

15. The process of claim 13 wherein said heating step is carried out in the presence of a color developer and said developer is provided on a sheet separate and distinct from said imaging sheet.

16. The process of claim 12 wherein said thermally rupturable microcapsules are microcapsules formed from a wall material which breaks down upon heating.

17. The process of claim 16 wherein said process consists essentially of the steps of image-wise exposing said imaging sheet and heating said imaging sheet to rupture said microcapsules.

18. The process of claim 17 wherein said heating step is carried out in the presence of a developer material and said developer material is provided on said imaging sheet.

19. The process of claim 17 wherein said heating step is carried out in the presence of a developer material and said developer material is provided on a sheet separate and distinct from said imaging sheet.

* * * * *